United States Patent
Mukasa

(10) Patent No.: US 7,861,767 B2
(45) Date of Patent: Jan. 4, 2011

(54) AIRFLOW GENERATING DEVICE AND ELECTRONIC APPARATUS

(75) Inventor: Tomoharu Mukasa, Saitama (JP)

(73) Assignee: Sony Corporation, Tokyo (JP)

( * ) Notice: Subject to any disclaimer, the term of this patent is extended or adjusted under 35 U.S.C. 154(b) by 139 days.

(21) Appl. No.: 11/380,540

(22) Filed: Apr. 27, 2006

(65) Prior Publication Data

US 2006/0245163 A1 Nov. 2, 2006

(30) Foreign Application Priority Data

Apr. 28, 2005 (JP) ............................ P2005-131875

(51) Int. Cl.
*F28F 7/00* (2006.01)
(52) U.S. Cl. ....................... 165/80.3; 165/121; 361/701
(58) Field of Classification Search ................ 165/80.3, 165/121, 908, DIG. 224; 361/692, 694, 697, 361/701; 417/413.2, 322; 92/96, 163; 310/328, 310/330
See application file for complete search history.

(56) References Cited

U.S. PATENT DOCUMENTS

| 5,758,823 | A | * | 6/1998 | Glezer et al. .................... 239/4 |
| 5,798,465 | A | * | 8/1998 | Ziada et al. .............. 73/861.21 |
| 6,123,145 | A | | 9/2000 | Glezer et al. |
| 6,353,295 | B1 | * | 3/2002 | Sridhar et al. ................ 315/248 |
| 6,588,497 | B1 | | 7/2003 | Glezer et al. |
| 2004/0223302 | A1 | * | 11/2004 | Pokharna ..................... 361/700 |

FOREIGN PATENT DOCUMENTS

| EP | 1020911 | * | 7/2000 |
| EP | WO 03012866 | | 2/2003 |
| EP | 1529963 | | 5/2005 |
| EP | 1715519 | | 10/2006 |
| EP | 1715566 | | 10/2006 |
| JP | 55101800 | | 8/1980 |
| JP | 02-213200 | | 8/1990 |
| JP | 02-213200 A | | 8/1990 |
| JP | 02213200 | | 8/1990 |
| JP | 03-116961 | | 5/1991 |
| JP | 03-116961 A | | 5/1991 |

(Continued)

OTHER PUBLICATIONS

EP Communication for Application No. 06006558.8-1242 dated Jun. 26, 2008.

(Continued)

*Primary Examiner*—Teresa J Walberg
(74) *Attorney, Agent, or Firm*—SNR Denton US LLP

(57) ABSTRACT

An airflow generating device includes a housing and a pressure changing mechanism. The housing has a first opening and a first chamber and contains gas. The first opening is where a first airflow is generated at a first flow velocity. The first chamber is connected to the first opening and is where a second airflow is generated. The second airflow has a second flow velocity which is a highest flow velocity in the first chamber and which is lower than the first flow velocity. A pressure changing mechanism discharges the gas through the first opening while generating the second airflow in the first chamber and the first airflow in the first opening by producing a pressure change in the gas in the housing.

8 Claims, 9 Drawing Sheets

FOREIGN PATENT DOCUMENTS

| | | | |
|---|---|---|---|
| JP | 3-168373 | * | 7/1991 |
| JP | 3-222878 | * | 10/1991 |
| JP | 2000-114760 | | 4/2000 |
| JP | 2000-223871 | | 8/2000 |
| JP | 2000-223871 A | | 8/2000 |
| JP | 2002-134975 A | | 5/2002 |
| JP | 2004-146547 A | | 5/2004 |
| WO | WO 2005/008348 | | 1/2005 |

OTHER PUBLICATIONS

Japanese Patent Office, Office Action issued in Patent Application JP 2005-131875, on Jan. 12, 2010.

* cited by examiner

AIRFLOW GENERATING DEVICE AND ELECTRONIC APPARATUS

CROSS REFERENCES TO RELATED APPLICATIONS

The present invention contains subject matter related to Japanese Patent Application JP 2005-131875 filed in the Japanese Patent Office on Apr. 28, 2005, the entire contents of which are incorporated herein by reference.

BACKGROUND OF THE INVENTION

1. Field of the Invention

The present invention relates to an airflow generating device which discharges gas and an electronic apparatus including the airflow generating device.

2. Description of the Related Art

Hitherto, an increase in the performance of a personal computer (PC) has caused an increase in the amount of heat generated from a heating element such as an integrated circuit (IC). Therefore, various heat-dissipation technologies or products have been proposed. Examples of heat-dissipation methods include the following. In one method, heat is dissipated by bringing a radiating fin, formed of a metal such as aluminum, into contact with an IC and conducting heat from the IC to the radiating fin. In another method, a fan is used to dissipate heat. The fan, for example, forcefully removes air warmed in a housing of a personal computer and introduces surrounding low-temperature air to the vicinity of a heating element. In still another method, a radiating fin and a fan are both used to dissipate heat. With the radiating fin increasing the area of contact between a heating element and air, the fan forcefully removes warmed air existing around the radiating fin.

However, in forceful convection of air with such a fan, a temperature boundary layer at a surface of the fin is produced at a downstream side of the fin, thereby giving rise to the problem that the heat from the radiating fin is not efficiently removed. This problem may be solved by, for example, reducing the thickness of the temperature boundary layer by increasing fan air velocity. However, increasing the rotational speed of the fan for the purpose of increasing the fan air velocity causes noise to be generated, such as noise from a fan bearing or noise of wind produced by the fan.

Methods using a vibrating plate that reciprocates periodically (refer to, for example, Japanese Unexamined Patent Application Publication Nos. 2000-223871 (FIG. 2), 2000-114760 (FIG. 1), 2-213200 (FIG. 1), and 3-116961 (FIG. 3)) are available as methods which efficiently allow heat from a radiating fin to escape to outside air by destroying the temperature boundary layer without using a fan as an air blower. Of devices in these four documents, in particular, the devices in Japanese Unexamined Patent Application Publication Nos. 2-213200 and 3-116961 include a vibrating plate which roughly divides space in a chamber in two, a resilient member disposed in the chamber and supporting the vibrating plate, and a unit which vibrates the vibrating plate. In these devices, for example, when the vibrating plate is displaced upwards, the volume of an upper space of the chamber is reduced. Therefore, the pressure in the upper space is increased. Since the upper space is connected to outside air through a suction-exhaust opening, a portion of the air in the upper space is discharged to the outside air by the pressure increase in the upper space. At this time, the volume of a lower space that is opposite to the upper space (the vibrating plate is disposed between the lower space and the upper space) is increased, causing the pressure in the lower space to decrease. Since the lower space is connected to the outside air through a suction-exhaust opening, the pressure reduction in the lower space causes a portion of the outside air existing near the suction-exhaust opening to be sucked into the lower space. In contrast, when the vibrating plate is displaced downwards, the volume of the upper space of the chamber is increased. Therefore, the pressure in the upper space is decreased. Since the upper space is connected to the outside air through the suction-exhaust opening, the pressure reduction in the upper space causes a portion of the outside air existing near the suction-exhaust opening to be sucked into the upper space. At this time, the volume of the lower space that is opposite to the upper space (the vibrating plate is disposed between the lower space and the upper space as mentioned above) is decreased, causing the pressure in the lower space to increase. The pressure increase in the lower space causes a portion of the air in the lower space to be discharged to the outside air. The vibrating plate is driven by, for example, an electromagnetic driving method. Accordingly, by reciprocating the vibrating plate, the discharging of the air in the chamber to the outside air and the sucking of the outside air into the chamber are periodically repeated. Pulsating air induced by a periodic reciprocating movement of the vibrating plate is blown against a heating element such as the radiating fin (heat sink), so that the temperature boundary layer at the surface of the radiating fin is efficiently broken, as a result of which the radiating fin is cooled with high efficiency.

SUMMARY OF THE INVENTION

In recent years, the amount of heat that is generated by increased IC clocking is increasing. Therefore, for example, in order to destroy a temperature boundary layer formed near a radiating fin due to the generation of the heat thereof, a larger amount of air is typically sent towards the IC or the radiating fin than it has been up until now. In a method for discharging air with a vibrating plate which reciprocates periodically, such as those described in the aforementioned four documents, the amount of air that is discharged can be increased by increasing the vibration amplitude of the vibrating plate. However, the larger the vibration amplitude of the vibrating plate, the higher the noise. Therefore, for practical purposes, the vibrating plate is typically operated with a small vibration amplitude at which the noise level does not bother anyone.

One cause of this noise is sound waves that are generated by a periodic variation in air pressure in a chamber caused by a reciprocating movement of a vibrating plate. The sound waves vibrate a wall surface of the chamber or propagate through the outside air via a suction-exhaust opening, as a result of which sound waves having the same frequency as the vibration frequency of the vibrating plate are discharged into the outside air. Therefore, the higher the vibration amplitude, the more serious is the problem of noise produced by these sound waves.

Another cause of the noise is airflow sound caused by a disturbance in airflow resulting from a reciprocating movement of the vibrating plate. The larger the vibration amplitude, the higher a maximum flow velocity of the air undergoing reciprocating movement. Therefore, in the chamber, a disturbance occurs in the airflow due to a structural member (such as a driving unit or the suction-exhaust opening) which inhibits the smooth flow of the air, or a disturbance occurs in the flow of air passing through the suction-exhaust opening at a high speed or in the airflow outside the suction-exhaust opening. Consequently, noise resulting from the airflow sound produced by such disturbances becomes a problem.

Although, as in, for example, Japanese Unexamined Patent Application Publication Nos. 2-213200 and 3-116961 (lower left column on page 2 in each of these documents), the noise generated by sound waves that are produced by air vibration resulting from a reciprocating movement of the vibrating plate can be reduced by moving the vibration frequency away from an audible area, the lower the frequency, the smaller an air discharge amount per unit time (the air discharge amount is proportional to the product of the vibration amplitude, effective cross-sectional area, and the frequency of the vibrating plate). In contrast, when the vibrating plate is vibrated with a high frequency outside the audible area, the vibration amplitude of the vibrating plate is considerably reduced by amplitude-frequency characteristics of a mechanical vibrating system including a driving unit. Therefore, the air discharge amount per unit time is reduced as expected. The airflow sound generated by a disturbance in the airflow in the chamber depends upon a maximum flow velocity of air rather than the vibration frequency of the vibrating plate. Therefore, the airflow sound is not typically restricted by a method which merely moves the vibration frequency away from the audible area.

In view of the aforementioned problems, it is desirable to provide an airflow generating device which can restrict generation of noise without reducing a gas discharge amount and cooling capacity, and an electronic apparatus including the airflow generating device.

According to an embodiment of the present invention, there is provided an airflow generating device including a housing and a pressure changing mechanism. The housing has a first opening and a first chamber and contains gas. The first opening is where a first airflow is generated at a first flow velocity. The first chamber is connected to the first opening and is where a second airflow is generated. The second airflow has a second flow velocity which is a highest flow velocity in the first chamber and which is lower than the first flow velocity. A pressure changing mechanism discharges the gas through the first opening while generating the second airflow in the first chamber and the first airflow in the first opening by producing a pressure change in the gas in the housing.

According to the embodiment of the present invention, the housing is formed so that the second flow velocity of the second airflow, which is the highest velocity occurring in the first chamber, is less than the flow velocity of the first airflow. Therefore, for example, even if the vibrating member is vibrated with a high vibration amplitude at which a predetermined air discharge amount is obtained, it is possible to reduce noise that is produced by the second airflow in the first chamber.

One cause of noise generated from the airflow generating device is airflow sound that is produced by a disturbance in airflow as a result of gas pressure in the housing being changed by the pressure changing mechanism. Such airflow sound is also produced when a disturbance occurs in the second airflow. Since the noise tends to be higher as the airflow velocity increases, according to the embodiment of the present invention, the flow velocity of the airflow that is produced in the first chamber is made as low as possible to restrict the noise produced by such airflow sound to the extent possible.

The direction of the first airflow and the direction of the second airflow may be the same or different.

The pressure changing mechanism may be a mechanism which produces laminar airflow or a mechanism which produces pulsating airflow (such as that described later). A mechanism which produces laminar airflow may be, for example, an axial fan.

The type of gas which may be used is not only air, but also nitrogen, helium gas, argon gas, or other types of gas.

A driving method of the vibrating member may make use of, for example, an electrostatic action, a piezoelectric action, or a magnetic action.

The vibrating member may have a planar shape or may have a three-dimensional shape, such as a conical shape or a shape with a side plate. The term "vibrating member" may encompass the term "resilient supporting member" for supporting the vibrating plate. The shape of the vibrating member in a plane substantially perpendicular to the direction of vibration of the vibrating member (that is, a plane contributing to changing gas pressure) is circular, elliptical, polygonal, or angular-and-circular. "Angular-and-circular" refers to a shape of an area surrounded by straight lines and curved lines, such as a polygonal shape having circular corners.

When pulsating flow is produced as mentioned above, in one form, the pressure changing mechanism includes a vibrating member which is supported by the housing so as to be capable of vibration for discharging the gas as pulsating gas. This makes it possible to discharge gas in a pulsating manner. Therefore, heat can be effectively dissipated by, for example, breaking a temperature boundary layer of a heating element.

In another form, the second flow velocity is in a range of from 0.5 to 3.0 [m$^2$/s]. This is because, when the second flow velocity is less than 0.5 [m$^2$/s], a large housing is typically used to obtain a predetermined gas discharge amount, and, when the second flow velocity exceeds 3.0 [m$^2$/s], noise that bothers human beings is generated.

In still another form, the first opening has an end disposed closer to the first chamber, and the vibrating member has a peripheral edge portion disposed at a distance of from 1.0 to 30.0 [mm] from the end of the first opening in substantially a direction of the first airflow. This is because, when the peripheral edge portion of the vibrating member is disposed closer than 1.0 [mm] from the end of the first opening, noise that bothers human beings is produced, and, when the peripheral edge portion of the vibrating member is further than 30.0 [mm] from the end of the first opening, the size of the vibrating member with respect to the housing is small, which is inefficient. According to the embodiment and forms of the present invention, it is desirable that a radius in the plane substantially perpendicular to the direction of vibration of the vibrating member (that is, the plane contributing to changing gas pressure) be in a range of from 10 to 40 [mm]. Here, when the plane is not circular, the term "radius" refers to the distance from the center of the plane to the closest peripheral edge portion of the vibrating member.

In still another form, the housing further has a second opening and a second chamber. The second opening is where a third airflow is generated at a third flow velocity. The second chamber is connected to the second opening, is disposed opposite to the first chamber with respect to the vibrating member, and is where a fourth airflow is generated at a fourth flow velocity which is less than the third flow velocity. By this, gas is alternately discharged through the first and second openings, and, in particular, phases of second sounds generated from the respective openings are opposite to each other, so that sound waves weaken each other. Therefore, the noise can be further reduced. In addition, as in the first chamber, it is possible to reduce noise that is produced by the fourth airflow in the second chamber.

When the housing further includes a second chamber as mentioned above, as with the first chamber, the fourth flow velocity is from 0.5 to 3.0 [m²/s]. Alternatively, the second opening has an end disposed closer to the second chamber, and the vibrating member has a peripheral edge portion disposed at a distance of from 1.0 to 30.0 [mm] from the end of the second opening in substantially a direction of the third airflow.

According to another aspect of the present invention, there is provided an electronic apparatus including a heating element, a housing, and a pressure changing mechanism. The housing has a first opening and a first chamber and contains gas. The first opening is where a first airflow is generated at a first flow velocity. The first chamber is connected to the first opening and is where a second airflow is generated. The second airflow has a second flow velocity which is a highest flow velocity in the first chamber and which is lower than the first flow velocity. A pressure changing mechanism discharges the gas towards the heating element through the first opening while generating the second airflow in the first chamber and the first airflow in the first opening by producing a pressure change in the gas in the housing.

Examples of the electronic apparatus are a computer (which may be a laptop computer or a desktop computer when the computer is a personal computer), a Personal Digital Assistance (PDA), an electronic dictionary, a camera, a display device, an audio/visual device, a projector, a cellular phone, a game device, a car navigator system, a robot apparatus, and other electronic products. The heating element may be an electronic part, such as an IC or a resistor, a radiating fin (heat sink), or any other element as long as it generates heat.

As mentioned above, according to the embodiments and forms of the present invention, it is possible restrict the generation of noise without reducing the gas discharge amount and cooling capacity.

DESCRIPTION OF THE PREFERRED EMBODIMENTS

Embodiments of the present invention will hereunder be described with reference to the drawings.

Figure 1:
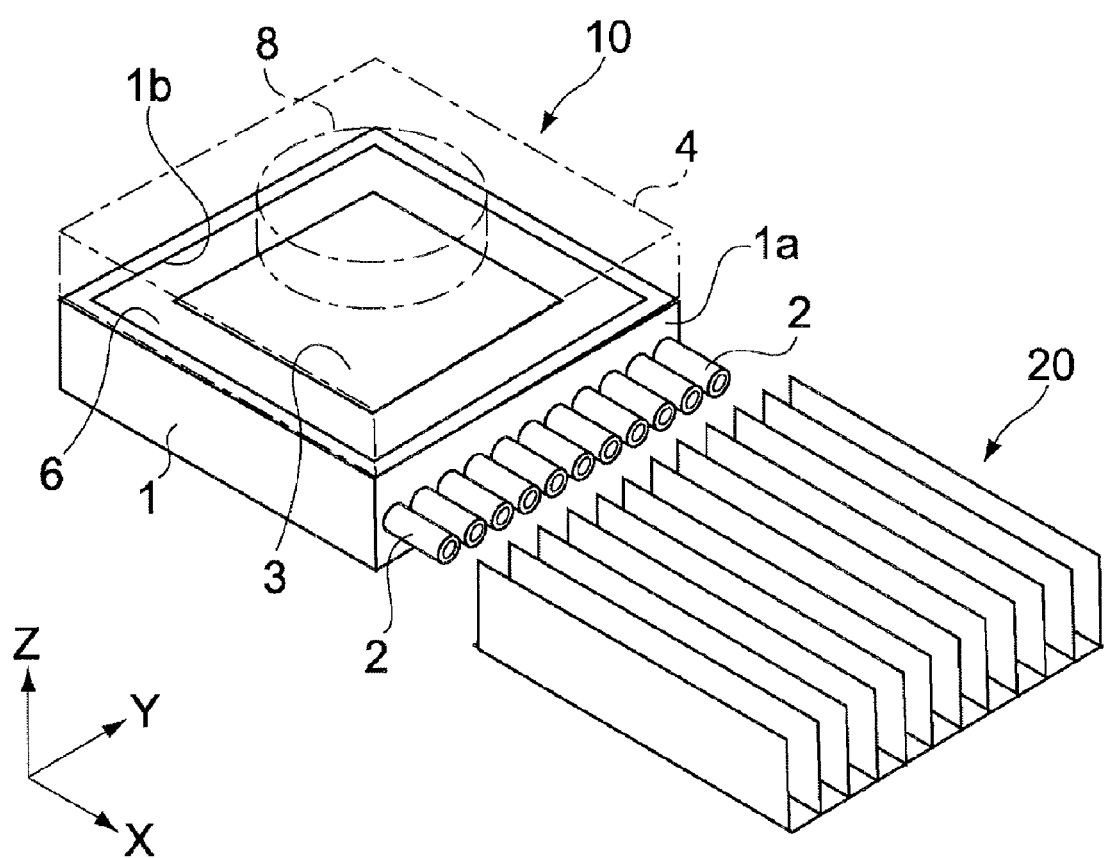
FIG. 1 is a perspective view of an airflow generating device and a heat sink according to an embodiment of the present invention.
Figure 2:
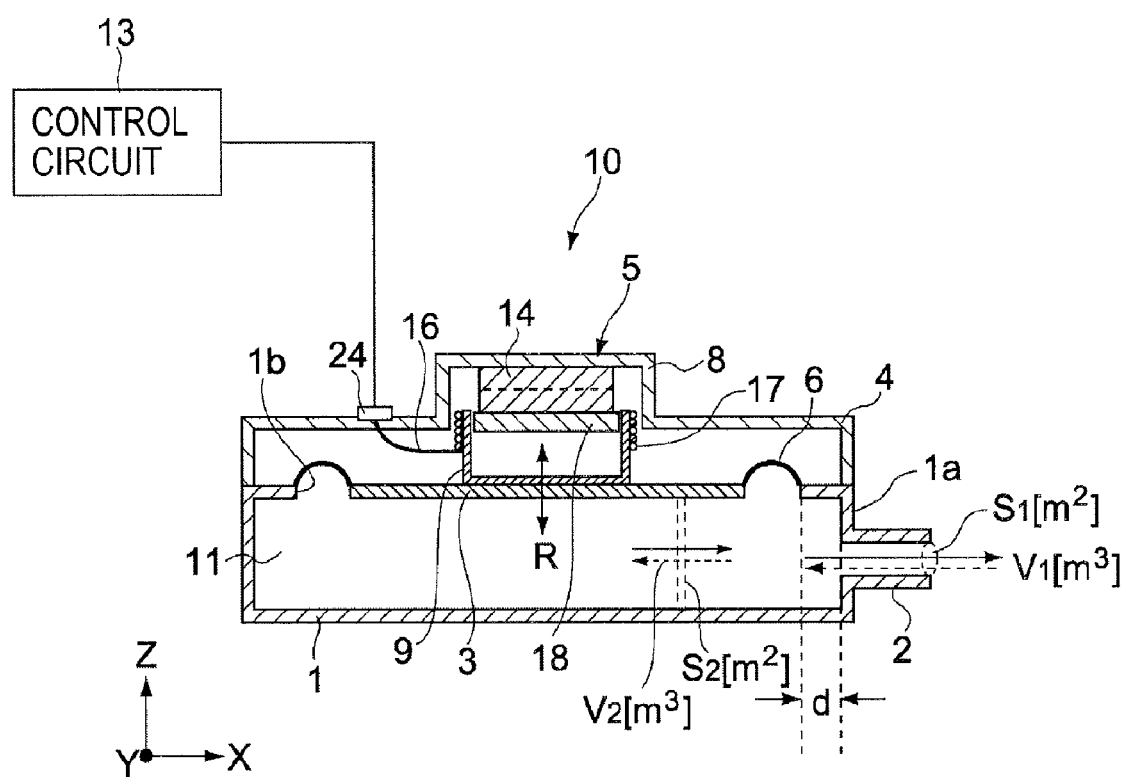
FIG. 2 is a sectional view of the airflow generating device shown in FIG. 1.

FIG. 1 is a perspective view of an airflow generating device and a heat sink according to an embodiment of the present invention. FIG. 2 is a sectional view of an airflow generating device 10 shown in FIG. 1.

The airflow generating device 10 includes a housing 1 having a rectangular hole 1b in an upper portion of the housing 1. A rectangular resilient supporting member 6 is mounted to a periphery of the hole 1b of the housing 1, and supports a vibrating plate 3. A chamber 11 is formed by the vibrating plate 3, the resilient supporting member 6, and the housing 1. A plurality of nozzles 2 for discharging air in the chamber 11 towards a heat sink 20 disposed outside the housing 1 are mounted to a side surface 1a of the housing 1. The nozzles 2 may be integrated to the housing 1. Instead of the plurality of nozzles 2, only one nozzle 2 may also be used.

An actuator 5 for driving the vibrating plate 3 is disposed at a top portion of the housing 1. For example, a magnet 14 which is magnetized in a vibration direction R of the vibrating plate 3 is disposed within a cylindrical yoke 8, and, for example, a disc-shaped yoke 18 is mounted to the magnet 14. A magnetic circuit is formed by the magnet 14 and the yokes 8 and 18. A coil bobbin 9 upon which a coil 17 is wound moves into and out of a space between the magnet 14 and the yoke 8. In other words, the actuator 5 is a voice coil motor. A power feed wire 16 is connected to the actuator 5. The power feed wire 16 is electrically connected to a control circuit 13 (such as a driving IC) through a terminal 24 mounted to a cover 4. An electrical signal is supplied to the actuator 5 from the control circuit 13.

The yoke 8 is integrally formed with the cover 4 covering the top portion of the housing 1. However, from the viewpoint of preventing spreading of magnetic flux generated by the magnet 14 from the yoke 8 to the cover 4, the yoke 8 and the cover 4 may be formed of different materials. The coil bobbin 9 is secured to a surface of the vibrating plate 3. The vibrating plate 3 can be vibrated in the directions of a double-headed arrow R (Z directions) by such an actuator 5.

The housing 1 is formed of, for example, resin, rubber, metal, or ceramic. Resin and rubber facilitate the formation of the housing 1 and are suited for mass-production. In addition, resin and rubber can increase a sound attenuation factor and can thus restrict noise, and can be used to reduce weight and costs. Considering heat dissipation of the housing 1, it is desirable that the metal be copper or aluminum having high thermal conductivity. The cover 4 is also formed of, for example, resin, rubber, metal, or ceramic. The housing 1 and the cover 4 may be formed of the same material or different materials. The resilient supporting member 6 is formed of, for example, resin or rubber.

The vibrating plate 3 is formed of, for example, resin, paper, rubber, or metal. Although the vibrating plate 3 is illustrated as having a planar shape, it may be cone-shaped like a vibrating plate having a speaker mounted thereto or may have a three-dimensional shape.

FIGS. 4A to 4E show various shapes of the vibrating plate in a plane that is perpendicular to the vibration direction R of the vibrating plate. The vibrating plate may be elliptical like a vibrating plate 43 shown in FIG. 4A or oblong like a vibrating plate 53 shown in FIG. 4B. Although not illustrated, the vibrating plate may also be circular. Vibrating plates 63, 73, and 83 shown in respective FIGS. 4C, 4D, and 4E have a square shape, a rectangular shape, and a rectangular shape having curved portions, respectively. Accordingly, although the planar shape of the vibrating plate may be freely chosen, a circular vibrating plate as well as its die is easier to produce. It is desirable that the planar shape of the housing 1, etc., of the airflow generating device 10 having any one of the vibrating plates 63, 73, and 83 shown in the respective FIGS. 4C to 4E be rectangular in accordance with the shape of the vibrating plate. For example, since an axial fan or the like rotates and blows air, its planar shape is circular. In contrast, since the vibrating plate of the airflow generating device 10 according to the embodiment does not necessarily have to be circular, it may be formed with flexibility in terms of shape, as shown in FIGS. 4A to 4E. Due to such flexibility in terms of shape, when, for example, the airflow generating device 10 is mounted to an electronic apparatus, such as a PC, its arrangement and shape can be chosen with greater freedom.

Although the sizes of the vibrating plate 43, etc., are not limited, for example, r may be in the range of from 5 to 100 [mm] as shown in FIGS. 4A to 4E. Here, r refers to the distance from the center of the vibrating plate to a closest peripheral edge portion of the vibrating plate. This r is set in the range of from 5 to 100 [mm], considering that the electronic apparatus including the airflow generating device 10 may be a range of apparatuses, for example, from a small cellular phone to a large display apparatus. More realistically, r is in the range of from 10 to 40 [mm].

With reference to FIG. 2, it is desirable that a distance d from a peripheral edge of the resilient supporting member 6 of the airflow generating device 10 to an opening end of each nozzle 2 (opening end disposed closer to the chamber 11) be in the range of from, for example, 1.0 to 30.0 [mm]. This is because, when d is less than 1.0 [mm], noise that bothers human beings is produced. It is thought that noise is produced by collision between a flow of air near the opening resulting from vibrating the vibrating plate 3 and a flow of air that is sucked in. In addition, the distance d is in the aforementioned range because, when d is greater than 30.0 [mm], the aforementioned r of the vibrating plate 3 with respect to the housing 1 becomes small, which is inefficient.

An operation of the airflow generating device 10 having the above-described structure will be described.

When, for example, a sinusoidal alternating voltage is applied to the actuator 5, the vibrating plate 3 undergoes sinusoidal vibration, causing the volume of the chamber 11 to increase or decrease. The change in the volume of the chamber 11 changes the pressure in the chamber 11, causing airflow from the nozzles 2 to be produced as pulsating airflow. For example, when the vibrating plate 3 is displaced in the direction in which the volume of the chamber 11 is increased, the pressure in the chamber 11 is reduced. This causes air outside the housing 1 to flow into the chamber 11 through the nozzles 2. In contrast, when the vibrating plate 3 is displaced in the direction in which the volume of the chamber 11 is reduced, the pressure in the chamber 11 is increased. This causes air in the chamber 11 to be discharged outside the chamber 11 through the nozzles 2 and to be blown against the heat sink 20. A reduction in air pressure around the nozzles 2 when the air is discharged from the nozzles 2 causes the air around the nozzles 2 to be sucked into the air that is discharged from the nozzles 2. That is, jets are combined. Such combined jets make it possible to cool the heat sink 20 as a result of blowing the combined jets against the heat sink 20.

Figure 3:
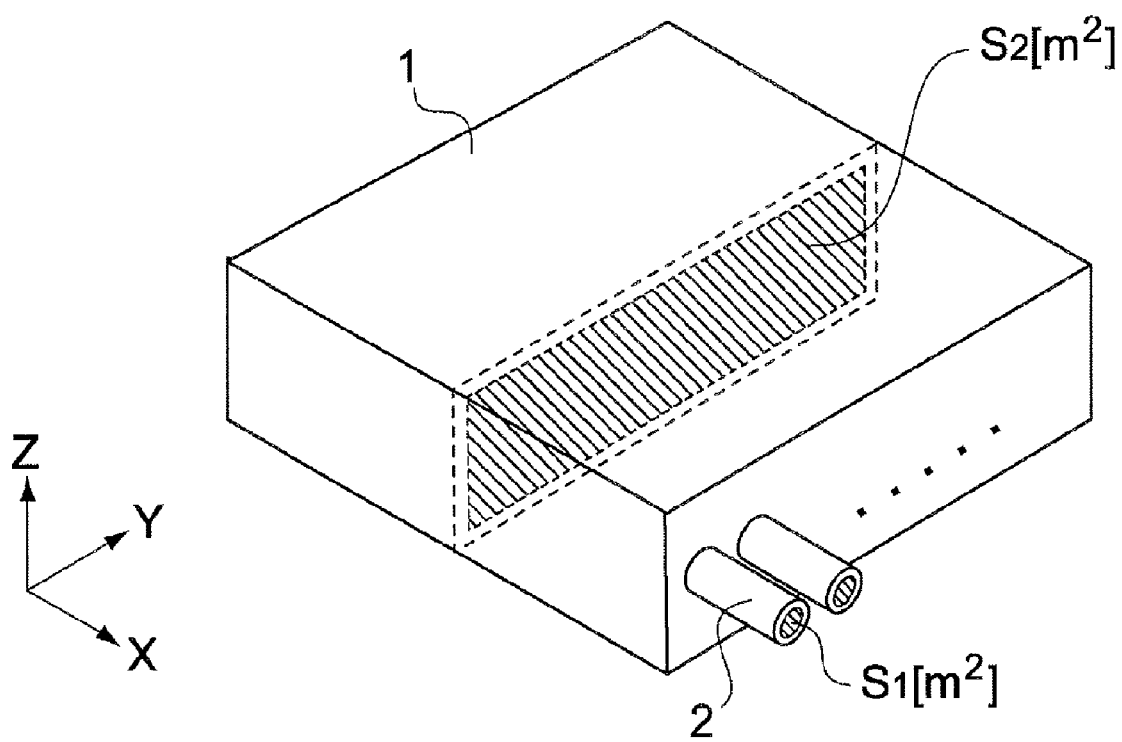
FIG. 3 is a schematic perspective view showing only a housing, in which a cover of the airflow generating device shown in FIGS. 1 and 2 is removed.
Figure 4A:
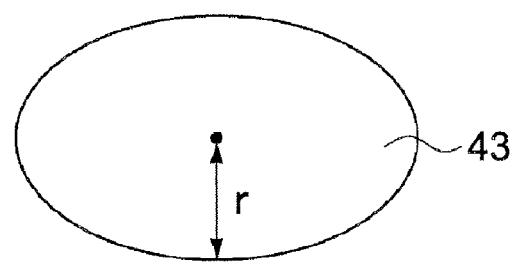
FIGS. 4A to 4E show various shapes of a vibrating plate in a plane that is perpendicular to a vibration direction of the vibrating plate.
Figure 4B:
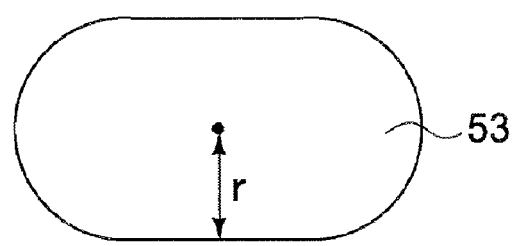
Figure 4C:
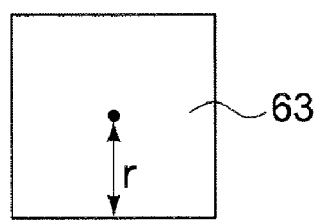
Figure 4D:
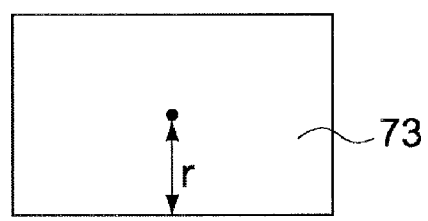
Figure 4E:
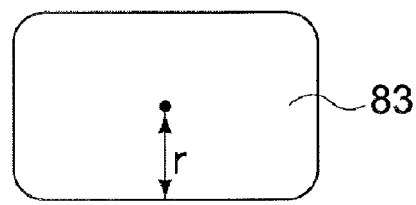

Here, referring to FIG. 2, when the pressure in the chamber 11 changes as a result of vibrating the vibrating plate 3, airflow is produced in the chamber 11 in the direction of an arrow (X direction) shown in FIG. 2. FIG. 3 is a schematic perspective view showing only the housing, in which the cover 4 of the airflow generating device shown in FIGS. 1 and 2 is removed. As shown in FIGS. 2 and 3, an opening area of the nozzles 2 is $S_1 [m^2]$, an airflow rate in the nozzles is $V_1 [m^3/s]$, a cross-sectional area in the chamber 11 where airflow having the highest flow velocity in the chamber 11 is produced and in a plane (Y-Z plane) substantially perpendicular to this airflow is $S_2 [m^2]$, and an airflow rate at this portion where the flow velocity is highest is $V_2 [m^3/s]$. In this case, the airflow generating device 10 satisfies the following formula:

$$V_2/S_2 \leq V_1/S_1$$

In other words, the airflow having the highest flow velocity in the chamber 11 is set so that its flow velocity is equal to or less than the flow velocity of the airflow that is produced at the opening in each nozzle 2. By this, even if, for example, the vibrating plate 3 is vibrated with a large vibration amplitude at which a predetermined gas discharge amount is obtained, noise that is produced by the airflow in the chamber 11 can be reduced. Since the higher the velocity of the airflow in the chamber 11, the higher the noise tends to be, according to the embodiment of the present invention, the flow velocity of the airflow that is produced in the chamber 11 is made as low as possible to restrict the noise that is produced by such airflow sound to the extent possible. However, when the flow velocity is too small, in order to obtain a predetermined air discharge amount, $S_2$ is set high, thereby increasing the size of the housing 1. Therefore, the flow velocity is not set very low. Consequently, a flow velocity in the chamber 11 at which a predetermined flow amount is obtained and noise is reduced is set.

Here, when a plurality of nozzles 2 are used, $S_1$ is the total of the opening areas of the nozzles 2. In this case, the flow velocity that is highest in the chamber 11 is in the range of from 0.5 to 3.0 $[m^2/s]$. This is because, when the highest flow velocity is less than 0.5 $[m^2/s]$, the size of the housing is made large to obtain a predetermined gas discharge amount, and, when the highest flow velocity exceeds 3.0 $[m^2/s]$, noise that bothers human beings is produced.

In the airflow generating device 10 shown in FIGS. 1 and 2, the interior of the chamber 11 has a substantially parallelepiped shape. Since this is a simple shape, airflows of the same velocity (but different directions) are produced at substantially all portions in the chamber 11.

Figure 5:
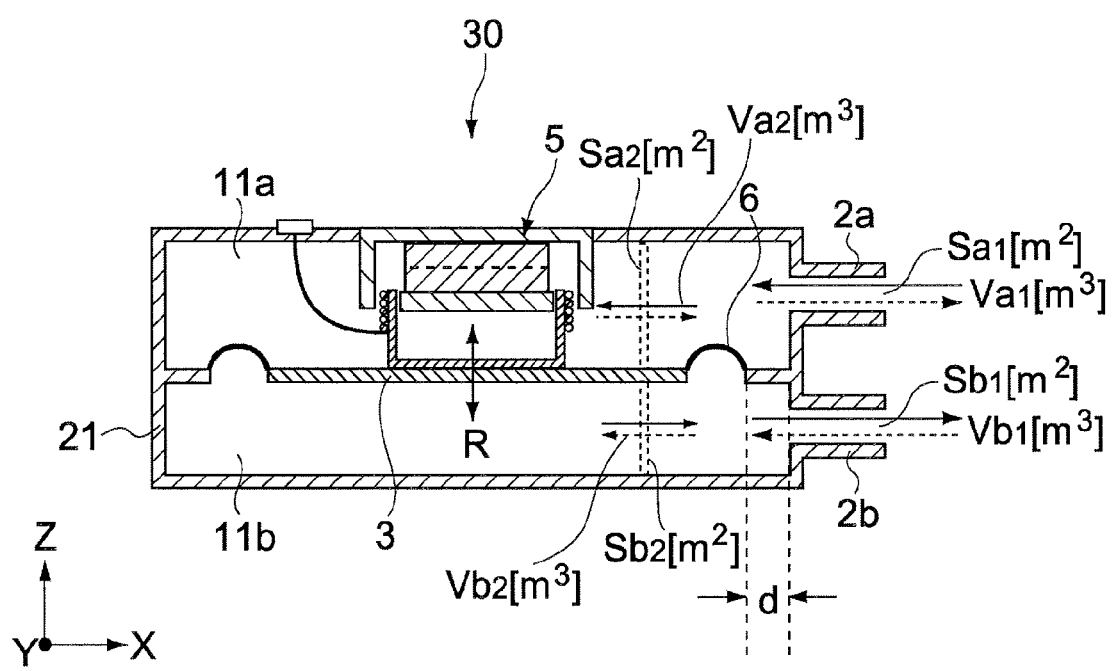
FIG. 5 is a sectional view of an airflow generating device according to another embodiment of the present invention.

FIG. 5 is a sectional view of an airflow generating device according to another embodiment of the present invention. Hereunder, description of parts, functions, etc. of the airflow generating device of this embodiment that correspond to those of the airflow generating device 10 of the previous embodiment will be simplified or omitted, that is, the description will be given focusing on the differences.

The interior of a housing 21 of an airflow generating device 30 is partitioned by a vibrating plate 3 and a resilient supporting member 6, so that a first chamber 11a and a second chamber 11b are formed in the housing 21. The housing 21 has nozzles 2a and 2b defining openings connected to the first chamber 11a and the second chamber 11b, respectively. A plurality of nozzles 2a and a plurality of nozzles 2b may be used, or only one nozzle 2a and one nozzle 2b may be used. In such an airflow generating device 30, applying, for example, a sinusoidal alternating voltage to an actuator 5 causes the vibrating plate 3 to vibrate. The vibration of the vibrating plate 3 alternately increases and decreases the pressure in the chambers 11a and 11b, so that air alternately flows into and out of the chambers 11a and 11b through the respective nozzles 2a and 2b. In other words, when air is discharged from the first chamber 11a to the outside of the housing 21 through the nozzle 2a, air flows into the second chamber 11b from the outside of the housing 21 through the nozzle 2b. In contrast, when air is discharged from the second chamber 11b to the outside of the housing 21 through the nozzle 2b, air flows into the first chamber 11a from the outside of the housing 21 through the nozzle 2a.

Figure 6:
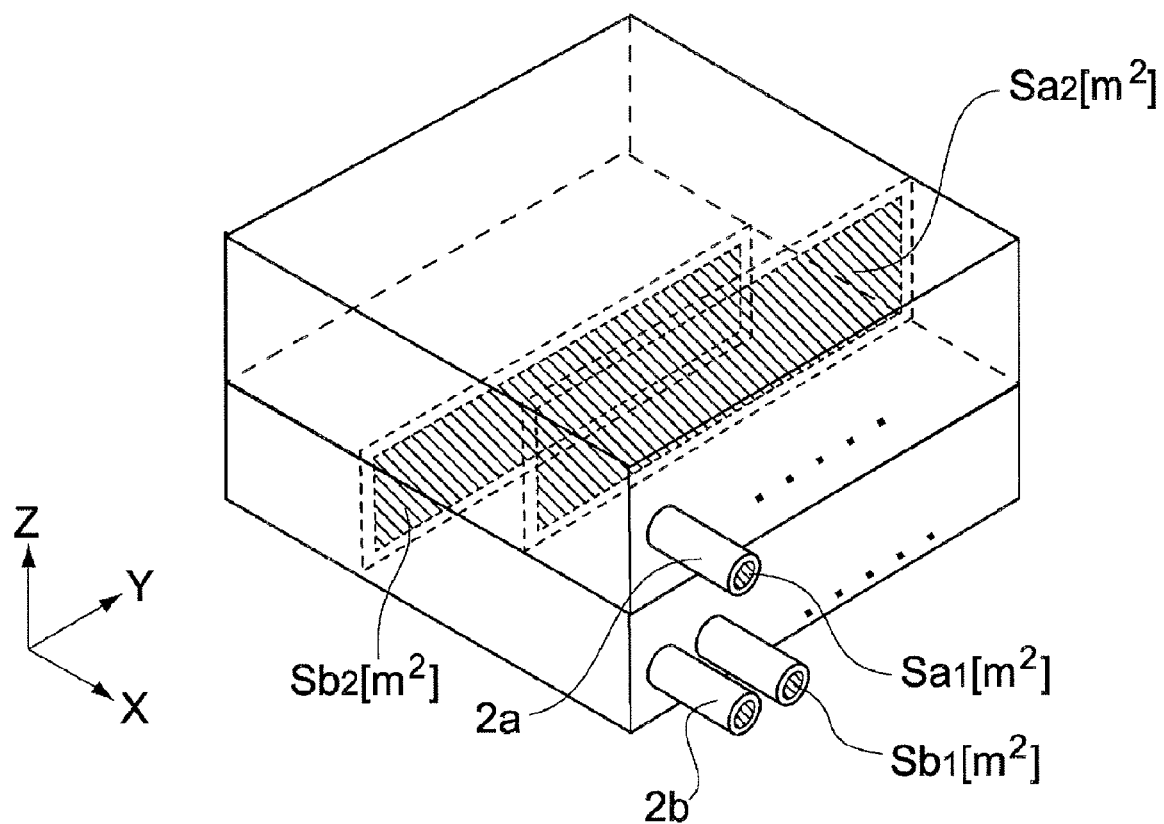
FIG. 6 is a schematic perspective view of the airflow generating device shown in FIG. 5.

Even in the airflow generating device 30, as shown in FIGS. 5 and 6, due to the same reasons as those in the airflow generating device 10, $Va_2/Sa_2 \leq Va_1/Sa_1$ and $Vb_2/Sb_2 \leq Vb_1/Sb_1$ are to be satisfied. More specifically, the flow velocity that is highest in each of the chambers 11a and 11b is set so as to be from 0.5 to 3.0 [m²/s]. Even in the airflow generating device 30, it is desirable that a distance d be set, for example, from 1.0 to 30.0 [mm].

Figure 7:
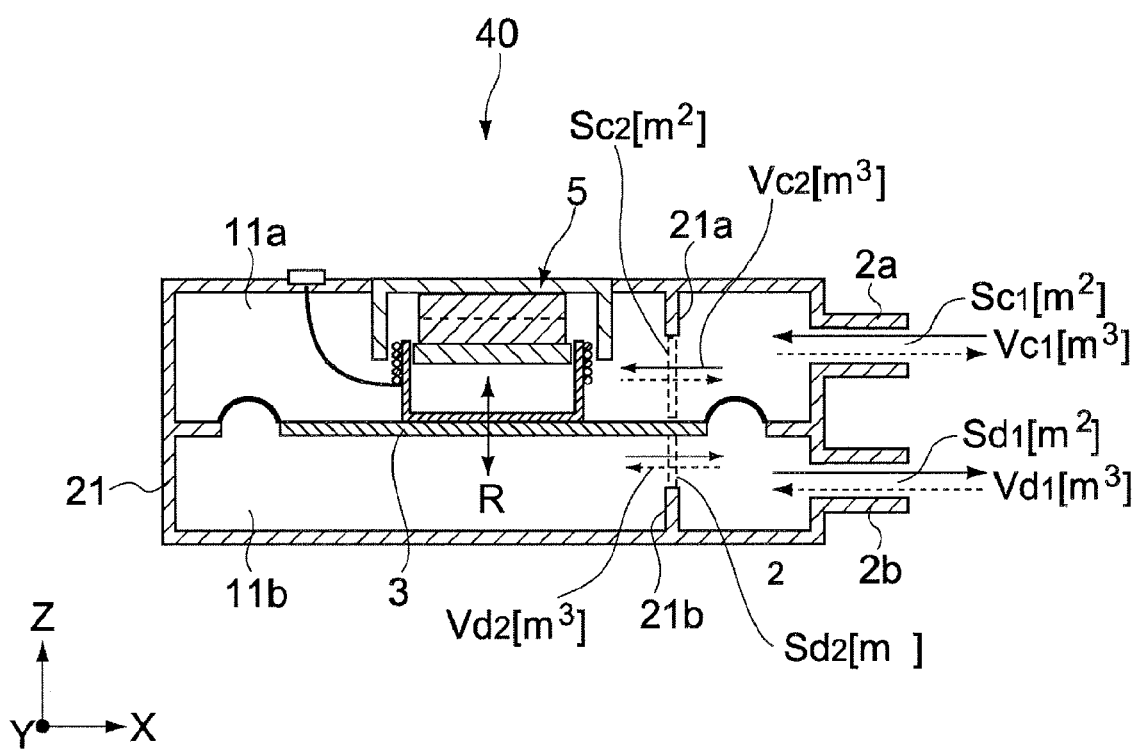
FIG. 7 is a sectional view of an airflow generating device having protrusions in a housing.

As shown in an airflow generating device 40 according to still another embodiment shown in FIG. 7, when protrusions 21a and 21b, etc., are disposed in a housing 21, for example, a flow velocity between the protrusion 21a and a vibrating plate 3 may be highest in the chamber 11a, and a flow velocity between the protrusion 21b and the vibrating plate 3 may be highest in the chamber 11b. The protrusions 21a and 21b are not intentionally formed. They are accidentally formed, for example, when forming the housing 21 in manufacturing the airflow generating device 40. Alternatively, the protrusions 21a and 21b may be intentionally formed. That is, the present invention is applicable to such intentionally formed protrusions 21a and 21b.

As in the previous embodiments, the airflow generating device 40 shown in FIG. 7 satisfies $Vc_2/Sc_2 \leq Vc_1/Sc_1$ and $Vd_2/Sd_2 \leq Vd_1/Sd_1$. More specifically, the flow velocity that is highest in each of the chambers 11a and 11b is set so as to be in the range of from 0.5 to 3.0 [m²/s]. Even in the airflow generating device 40, it is desirable that a distance d shown in FIG. 2 be set, for example, in the range of from 1.0 to 30.0 [mm].

Figure 8:
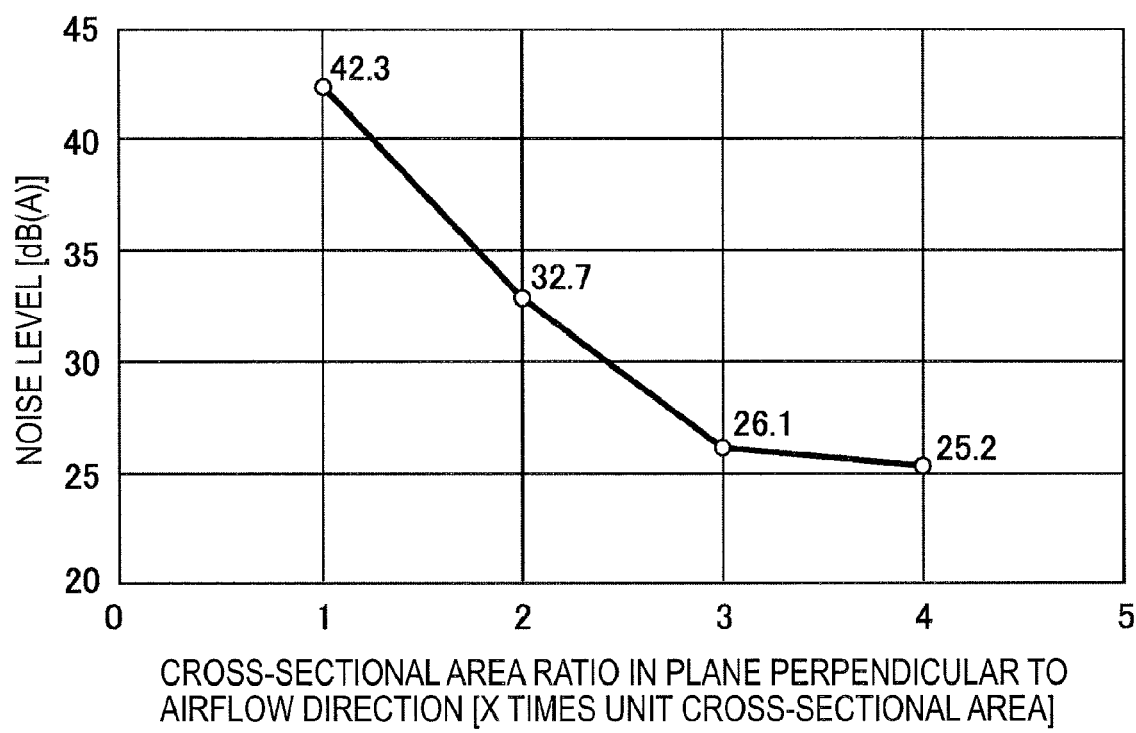
FIG. 8 is a graph showing noise level resulting from production of airflow in the housing of the airflow generating device in each of the embodiments.

FIG. 8 is a graph showing noise level (A characteristic) resulting from producing airflow in the housing in the airflow generating device in each of the embodiments. It is a graph showing the relationship between the noise level (A characteristic) and cross-sectional area ratio. "A characteristic" refers to an auditory sensation characteristic in which, the lower the sound (the lower the frequency of the sound), the less easily human beings perceive noise, so that "sound pressure level" is one that is corrected so as to match such an auditory sensation characteristic. This graph shows the results of an experiment in which, when the noise level that is produced by a flow of air passing a certain unit cross-sectional area is 42.3 [dB(A)], noise that is produced by a flow of air passing a cross-sectional area that is larger than the unit cross-sectional area and having the same flow rate as the flow of air passing the unit cross-sectional area is numerically expressed. Along the horizontal axis, the cross-sectional area is varied by 2 times, 3 times, etc. of the unit cross-sectional area. This graph shows that, the larger the cross-sectional area, the lower the noise level. In particular, by making the cross-sectional area 4 times the unit cross-sectional area, the noise level is reduced by approximately 17 [dB].

Figure 9:
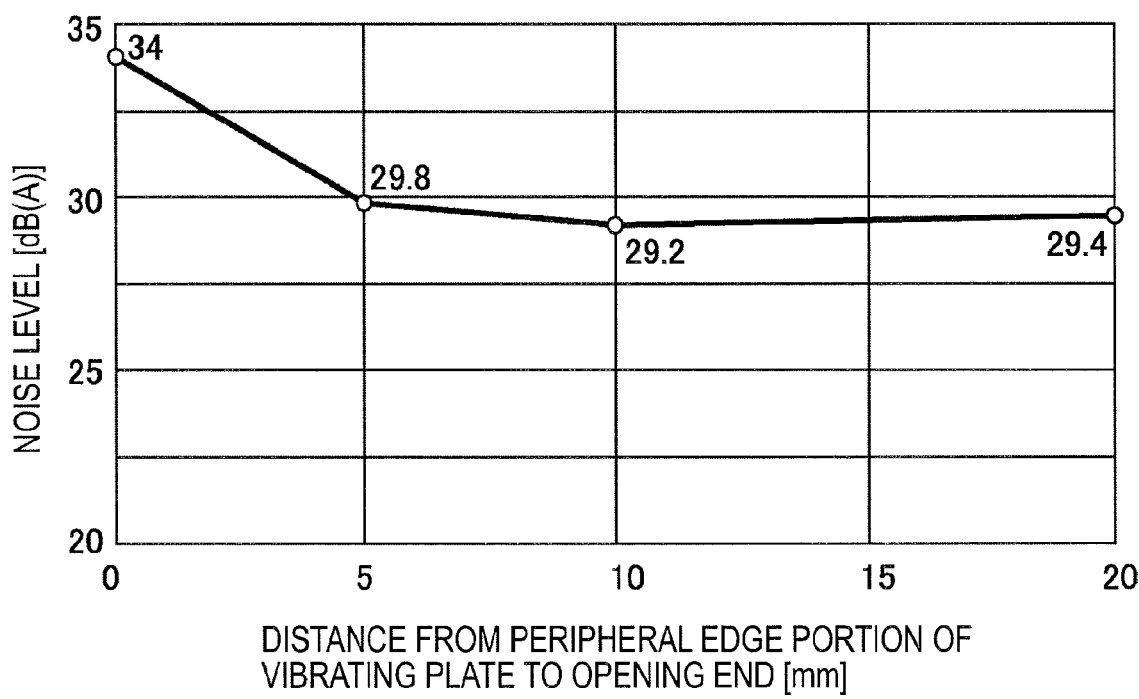
FIG. 9 is a graph showing relationship between distance and the noise level in the airflow generating device shown in FIG. 2.

FIG. 9 is a graph showing relationship between the distance d and the noise level (A characteristic) in the airflow generating device 30 shown in FIG. 2. The graph shows that, in particular, when d is equal to or greater than 1 [mm], the noise is less than 30 [dB], so that the noise is reduced. In addition, in particular, setting the distance d in the range of from 2 to 5 [mm] reduces the noise level by approximately 4 [dB].

The present invention is not limited to the above-described embodiments, so that various modifications may be made.

The airflow generating devices 10, 30, etc. are described as being devices which discharge air in a pulsating fashion as a result of changing air pressure in the housing using the vibrating plate 3. However, they may be devices which discharge air as a result of generating laminar airflow of, for example, an axial fan in the housing.

The airflow generating devices 10, 30, etc., may be used as devices for supplying fuel of a fuel battery. More specifically, oxygen (air) suction inlets of a fuel battery body and the nozzles of the airflow generating device of any of the embodiments are disposed so as to face each other. This allows flowing air discharged from the airflow generating device to be sucked in as oxygen fuel from the suction inlet.

What is claimed is:

1. An airflow generating device comprising:
   a housing;
   a pressure changing mechanism which produces a pressure change in a gas inside of said housing and includes a vibrating member within said housing in a spaced a part distance with respect to the walls of said housing;
   a resilient supporting member having a first edge attached to said vibrating member and a second edge attached to a side wall of said housing;
   a first opening in said housing disposed at a distance from a peripheral edge portion of said vibrating member;
   a first chamber inside of said housing and in fluid communication with said first opening;
   a heat sink disposed outside of the housing; and
   a nozzle on a side surface of said housing through which the gas flows in and out of said first chamber,
   wherein,
      said resilient supporting member is located a horizontal distance d, from said nozzle, where 1 mm $\leq$ d $\leq$ 30 mm,
      said vibrating member has a distance r from the center of said vibrating member to a closest peripheral edge portion of said vibrating member of 5 to 100 mm,
      said pressure changing mechanism discharges said gas through said first opening generating a first airflow at a first flow velocity v1 through said first opening, and a second airflow at a second flow velocity v2 in said first chamber such that said second flow velocity v2 is less than said first flow velocity v1,
      said nozzle has a cross sectional area $S_1$ and an airflow rate v1,
      said first chamber has a cross-sectional area $S_2$ in said first chamber parallel to said cross sectional area $S_1$, and
      said pressure generating mechanism generates an airflows such that $v2/S_2 \leq v1/S_1$.

2. The airflow generating device according to claim 1, wherein the second flow velocity is in a range of from 0.5 to 3.0 m²/s.

3. The airflow generating device according to claim 1, wherein the first opening has an end disposed closer to the first chamber.

4. The airflow generating device according to claim 1, wherein the housing further comprises:
   a second opening in a portion of said housing;
   a second chamber opposite of said first chamber with respect to said vibrating member and in fluid communication with said second opening;
   a third airflow at a third flow velocity in said second opening; and
   a fourth airflow at a fourth flow velocity in said second chamber,
   wherein,
      said fourth flow velocity is less than the third flow velocity.

5. The airflow generating device according to claim 4, wherein the fourth flow velocity is in a range of from 0.5 to 3.0 m²/s.

6. The airflow generating device according to claim 4, wherein the second opening has an end disposed closer to the second chamber.

7. The airflow generating device according to claim 1 wherein, said first chamber includes a cross-sectional area that is at least three times greater than the cross-sectional area of the nozzle.

8. An electronic apparatus comprising:
- a heating element;
- a housing;
- a pressure changing mechanism which produces a pressure change in a gas inside of said housing and includes a vibrating member within said housing in a spaced a part distance with respect to the walls of said housing;
- a resilient supporting member having a first edge attached to said vibrating member and a second edge attached to a side wall of said housing;
- a first opening in said housing disposed at a distance from a peripheral edge portion of said vibrating member;
- a first chamber inside of said housing and in fluid communication with said first opening;
- a heat sink disposed outside of the housing; and
- a nozzle on a side surface of said housing through which the gas flows in and out of said first chamber, wherein,
- said resilient supporting member is located a horizontal distance d, from said nozzle, where 1 mm$\leq$d$\leq$30 mm,
- said vibrating member has a distance r from the center of said vibrating member to a closest peripheral edge portion of said vibrating member of 5 to 100 mm,
- said pressure changing mechanism discharges said gas through said first opening generating a first airflow at a first flow velocity v1 through said first opening, and a second airflow at a second flow velocity v2 in said first chamber such that said second flow velocity v2 is less than said first flow velocity v1,
- said nozzle has an cross sectional area $S_1$ and an airflow rate v1,
- said first chamber has a cross-sectional area $S_2$ in said first chamber parallel to said cross sectional area $S_1$ and
- said pressure generating mechanism generates an airflows such that v2/$S_2$$\leq$v1/$S_1$.

* * * * *